United States Patent [19]

Tsuruta

[11] Patent Number: 5,274,265
[45] Date of Patent: Dec. 28, 1993

[54] BIPOLAR TRANSISTOR WITH A PARTICULAR ELECTRODE STRUCTURE

[75] Inventor: Masataka Tsuruta, Kyoto, Japan
[73] Assignee: Rohm Co., Ltd., Kyoto, Japan
[21] Appl. No.: 862,926
[22] Filed: Apr. 3, 1992
[51] Int. Cl.$^5$ .................. H01L 27/082; H01L 27/102; H01L 29/70; H01L 31/11
[52] U.S. Cl. .................................... 257/587; 257/586; 257/571; 257/565
[58] Field of Search .................. 357/34, 35, 55; 257/565, 586, 587, 571

[56] References Cited

U.S. PATENT DOCUMENTS 3,777,227 12/1973 Krishna et al. ............... 257/586
4,857,980 8/1989 Hoeberechts ................. 357/55
5,084,750 1/1992 Adlerstein ................... 257/586

Primary Examiner—Rolf Hille
Assistant Examiner—Wael Fahmy
Attorney, Agent, or Firm—Lowe, Price, LeBlanc & Becker

[57] ABSTRACT

A semiconductor device and a method of manufacture thereof by which the device is formed without an epitaxial growth process are provided. The semiconductor device has low circuit resistance and is highly reliable due to a sufficient device strength. Although a base layer or other devices are formed in an N$^-$ type silicon layer, the process of epitaxial growth is eliminated, because the semiconductor substrate (2) consists entirely of the N$^-$ type silicon. Further, the substrate has a bottom recessed part (4) which extends near a base layer (21). A collector electrode (8) is attached to the bottom recessed part (4), allowing collector resistance to be reduced. Moreover, the substrate (2) is not formed thin throughout, partly provided with the bottom recessed part (4). As a result, the resulting semiconductor device holds a sufficient strength.

2 Claims, 5 Drawing Sheets

F I G. 2
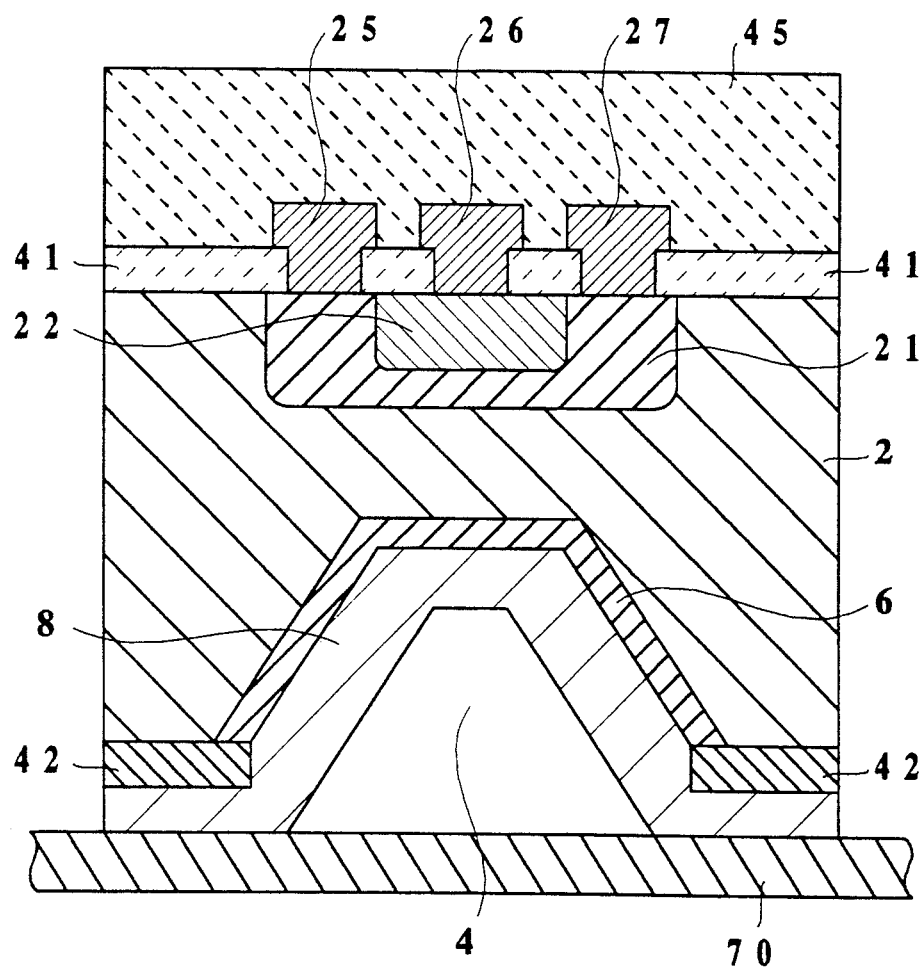

BIPOLAR TRANSISTOR WITH A PARTICULAR ELECTRODE STRUCTURE

BACKGROUND OF THE INVENTION

1. Field of the Invention

The present invention relates to a semiconductor device and a method of manufacture thereof and, more particularly, to a technique to provide a semiconductor device which is readily manufactured without epitaxial growth process and is highly reliable.

2. Description of the Prior Art

A conventional transistor which is one of the semiconductor device is shown in FIG. 1. In this transistor, an N− type epitaxially grown layer 31 is formed on an N+ type silicon substrate 30. Further, the N− type epitaxially grown layer 31 is provided with a P type diffusion layer 32 and an N type diffusion layer 33, to which a base electrode 34 and an emitter electrode 35 are attached, respectively. In addition, a base terminal T1 and an emitter terminal T2 are connected to the base electrode 34 and the emitter electrode 35, respectively. Also, a collector electrode 36 is formed on the bottom surface of the N+ type silicon substrate 30 whereto a collector terminal T3 is connected.

Such a transistor is manufactured as follows. First, the N− type epitaxially grown layer 31 is grown on the N+ type silicon substrate 30 by epitaxial growth. The epitaxial growth is performed in such a way that the silicon substrate, along with a proper amount of gas, is heated to a high temperature of 1000° C. or more. This treatment allows the N− type epitaxially grown layer 31 to structurally adjoin the N+ type silicon substrate 30.

Next, the P type diffusion layer 32 and the N type diffusion layer 33 are formed in the N− type epitaxially grown layer 31. Here, the N− type epitaxially grown layer 31 is provided for forming the P type diffusion layer 32 and the N type diffusion layer 33. This is because the N+ type layer contains a higher density of impurities and has a lower resistance value as compared with the N− type layer. This means that desired electrical characteristics of a transistor may not be achieved in the case where a device is formed in the N+ type layer due to failure in having high breakdown voltage. Also, the P type diffusion layer 32 and the N type diffusion layer 33 are formed by implanting ions or other impurities and performing thermal diffusion.

Subsequent to device formation in the P type diffusion layer 32 or other layers, an insulating layer 37 is provided on the top surface of the N− type epitaxially grown layer 31. Thereafter, the base electrode 34 and the emitter electrode 35 are formed, to which the base terminal T1 and the emitter terminal T2 are connected, respectively. Further, the collector electrode 36 and the collector terminal T3 are formed on the bottom surface of the N+ type silicon substrate 30.

In a semiconductor device such as a transistor, the N+ type silicon substrate 30 is formed rather thick in order to give a sufficient strength to the device, as shown in FIG. 1. Moreover, the N+ type silicon substrate 30, which is an N+ type layer, contains a higher density of impurities and has a lower resistance value, as described earlier. Consequently, the semiconductor device holds a sufficient strength due to the thick substrate, maintaining its collector resistance at a low level.

The conventional semiconductor device described above, however, involves the following problem. In the transistor shown in FIG. 1, epitaxial growth is performed to grow the N− type epitaxially grown layer 31 on the N+ type silicon substrate 30. The epitaxial growth at this step is such that it requires a long time for crystal growth, decreasing the productivity in the manufacture of transistors.

In order to solve this problem, a way of forming a device directly in the surface of an N− type silicon substrate, which is adopted instead of the N+ type silicon substrate, has been thought. This method permits the process of epitaxial growth to be eliminated, because the whole silicon substrate is originally arranged as N− type.

Nevertheless, the method mentioned above involves further problem. The resistance value of the N− type layer is higher than that of the N+ type layer, as described earlier. Hence, in the case where the N+ type silicon substrate 30 shown in FIG. 1 is replaced with the N− type silicon substrate, a collector formed on the bottom surface of the substrate has such high resistance that a saturation current characteristic and a frequency characteristic of a transistor may be deteriorated. Although the collector resistance may be diminished by reducing transistor thickness and thereby placing the collector electrode 36 near the P type diffusion layer 32, this measure would lead to decreasing the strength of a transistor involved.

SUMMARY OF THE INVENTION

An object of the present invention is to provide a semiconductor device which is manufactured without the process of epitaxial growth, having lowered circuit resistance and elevated reliability owing to a sufficient strength of the device.

According to a feature of the invention, there is provided a semiconductor device comprising:

a semiconductor substrate having a resistance value appropriate for forming a device region, being provided with a bottom recessed part having a bottom recessed face;

the device region which is in a top surface of the semiconductor substrate, being formed near the bottom recessed face; and an electrode connected to the bottom recessed face.

According to a further feature of the invention, there is provided a method for manufacturing a semiconductor device comprising the steps of:

providing a semiconductor substrate having a resistance value appropriate for forming a device region with a bottom recessed part having a bottom recessed face;

forming the device region which is in a top surface of the semiconductor substrate near the bottom recessed face; and connecting an electrode to the bottom recessed face.

BRIEF DESCRIPTION OF THE DRAWINGS

FIG. 2 is a cross-sectional view illustrating a transistor which is an embodiment of a semiconductor device of the present invention.

DESCRIPTION OF THE PREFERRED EMBODIMENT

A semiconductor device and a method of manufacture thereof according to an embodiment of the present invention will be described below. FIG. 2 shows a cross-sectional view of an NPN type transistor which is a semiconductor device. FIGS. 3A-3C, FIGS. 4A-4C and FIGS. 5A-5C show manufacturing steps of the transistor shown in FIG. 2, respectively.

Figure 1:
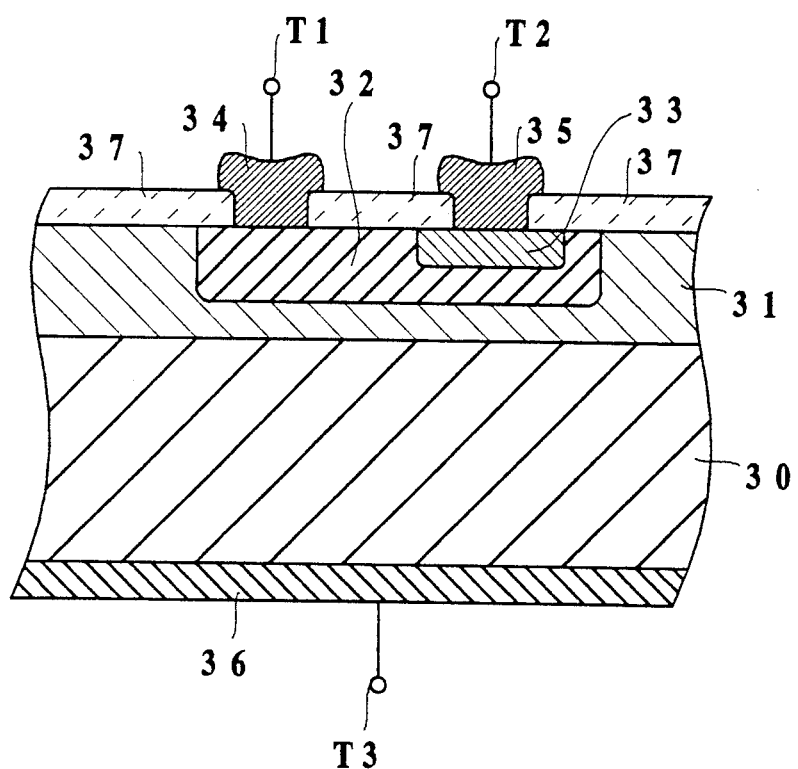
FIG. 1 is a cross-sectional view illustrating a conventional semiconductor device.
Figure 3A:
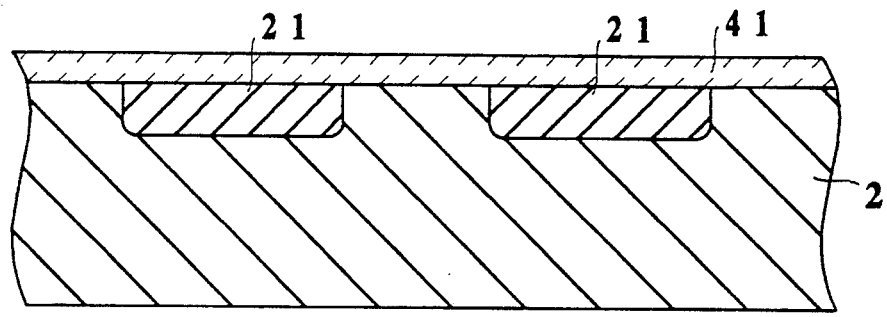
FIGS. 3A–3C are cross-sectional views illustrating steps for manufacturing the transistor shown in FIG. 2.

In this embodiment, an N⁻ type silicon substrate 2 is used as a semiconductor substrate in FIG. 3A. The N⁻ type silicon substrate 2 contains a higher density of impurities and has a lower resistance value, so that it is appropriate for device formation. First, the N⁻ type silicon substrate 2 is placed in an oxygen atmosphere so as to grow a silicon dioxide layer 41 on its top surface (FIG. 3A).

Next, boron ions are implanted into the top surface of the N⁻ type silicon substrate 2, and thereafter thermally diffused to form a P type base layer 21 which acts as device region (FIG. 3A). This process is carried out using photoetching method (photoresist) as follows. Device pattern is formed by the use of a mask layer (not shown), and then boron ions are implanted. Some of boron ions is blocked by the mask layer according to the precedent pattern, so that the base layer 21 is formed in a desired place.

Figure 3B:
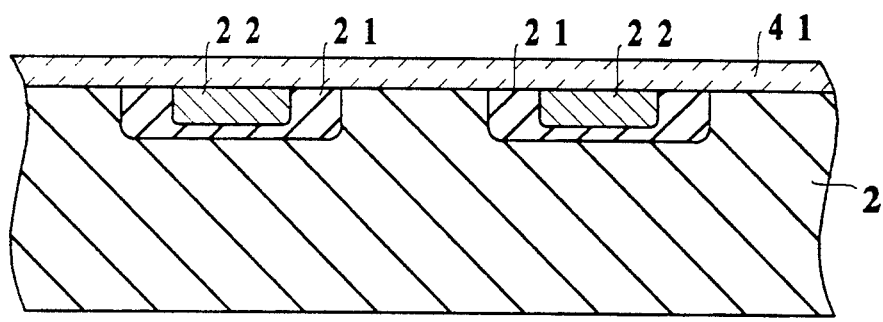
Figure 3C:
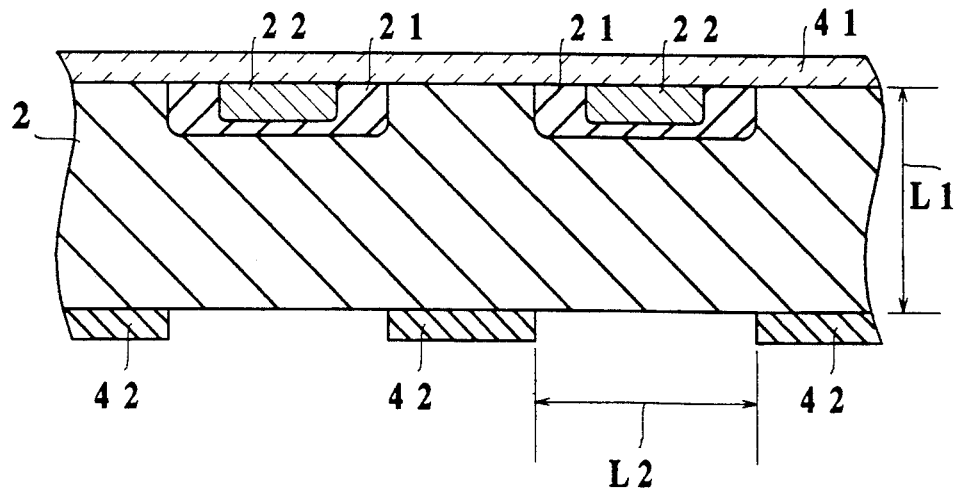

Further, an N⁺ type emitter layer 22 is produced in the base layer 21, as shown in FIG. 3B. The photoetching method is again used to form the emitter layer 22 in a similar manner as in the case of the base layer 21. In this case, arsenic ions, phosphorous ions, or the like are subjected to implantation and thermal diffusion. Then, a bottom face processing mask 42 is applied on the bottom face of the N⁻ type silicon substrate 2, as shown in FIG. 3C.

Figure 4A:
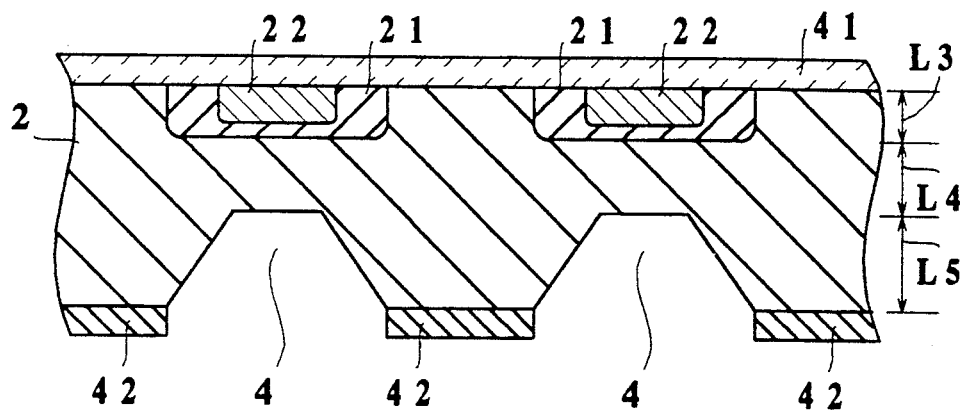
FIGS. 4A–4C are cross-sectional views illustrating further steps for manufacturing the transistor shown in FIG. 2.

Thereafter, with the aid of the bottom face processing mask 42, the substrate is provided with a bottom recessed part 4, as shown in FIG. 4A. This is conducted by means of chemical etching by the use of potassium hydroxide or the like. The etching depth L5 of the bottom recessed part 4 can be controlled by varying the opening width L2 (FIG. 3C). In this embodiment, the thickness L1 (FIG. 3C) and the opening width L2 are approximately 500 μm and 700 μm, respectively. Determining an appropriate opening width L2 allows the etching depth L5 to extend as far as approximately 10 μm to the base layer 21, that is, the interval L4 (FIG. 4) is formed approximately 10 μm thick. Incidentally, the base layer 21 is approximately 2 μm thick.

Figure 4B:
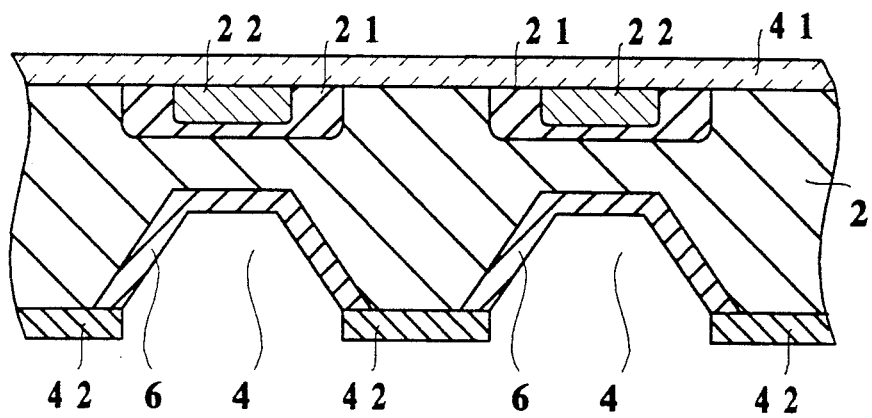
Figure 4C:
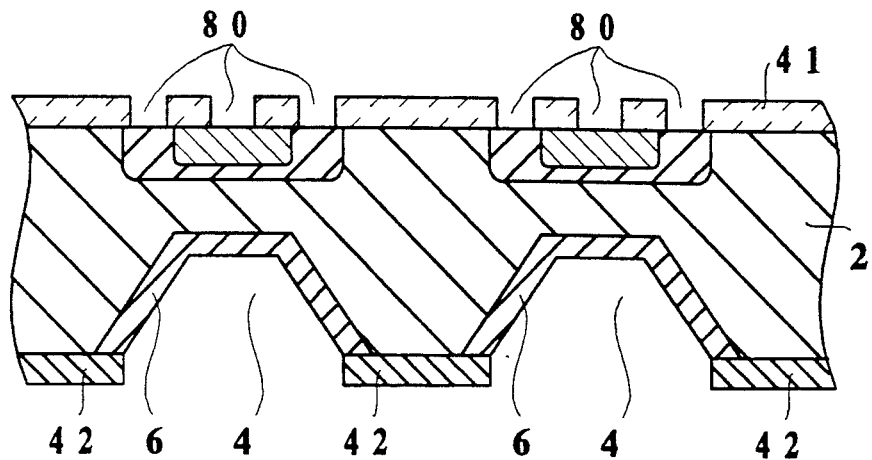

Next, phosphorous ions or the like are implanted into the bottom recessed part 4 and, thereafter, subjected to thermal diffusion to thereby form a bottom diffusion layer 6 which is an N⁺ type semiconductor layer (FIG. 4B). If the collector electrode is directly attached to the N⁻ type silicon substrate 2 having high resistance without forming the layer 6, electrical characteristics of the resulting transistor may be deteriorated due to parasitic diodes generated. The bottom diffusion layer 6, therefore, is formed to relieve the great difference in resistance between the N type silicon substrate 2 and the collector electrode.

Figure 5A:
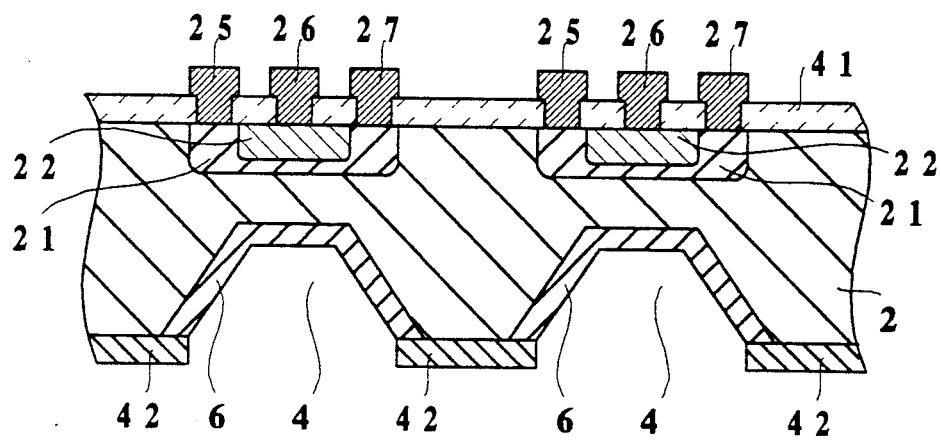
FIGS. 5A-5C are cross-sectional views illustrating still further steps for manufacturing the transistor shown in FIG. 2.
Figure 5B:
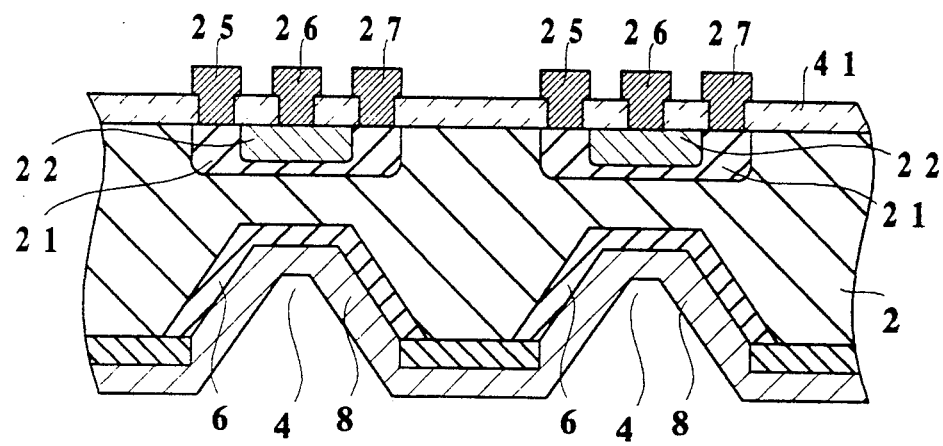

Subsequent to the bottom diffusion layer 6, openings 80 for attaching electrodes are etched to form (FIG. 4C), to which base electrodes 25 and 27, and an emitter electrode 26 are attached (FIG. 5A). Further, the bottom recessed part 4 is provided with a collector electrode 8, as shown in FIG. 5B. Aluminum or the like is used as a material for the collector electrode 8. Thereafter, a protective layer 45 are formed on the N⁻ type silicon substrate 2 (FIG. 5C) by the use of phospho-silicate glass or a nitride layer.

Figure 5C:
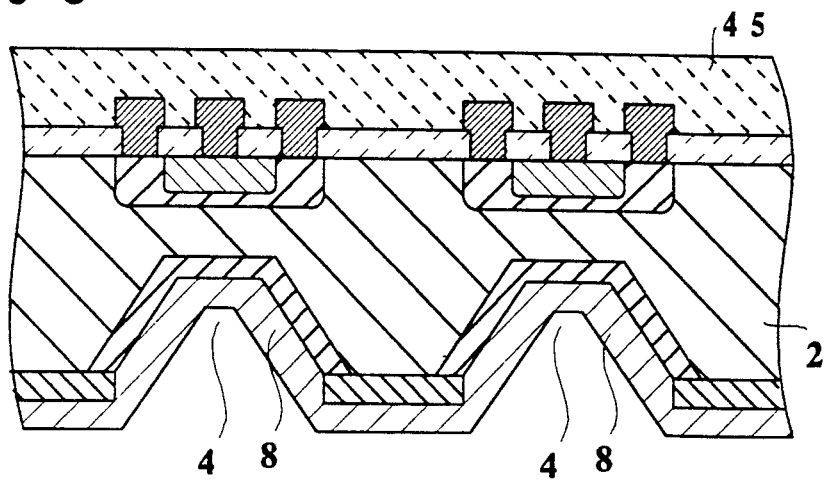

In the state of FIG. 5C, the N⁻ type silicon substrate 2 are diced in a fixed width, mounted on a lead frame 70 (FIG. 2), so that the transistor shown in FIG. 2 is obtained. Clearly, this manufacturing method eliminates the need for epitaxial growth, allowing transistors or other semiconductor devices to be readily manufactured. Moreover, the N⁻ type silicon substrate 2, although its resistance value is high, has the bottom recessed part 4, so that the collector electrode 8 is allowed to situate close to the base layer 21. Accordingly, the collector resistance can be reduced. In addition, this method does not allow the N⁻ type silicon substrate 2 to be formed thin throughout, partly providing with the bottom recessed part 4 so as to place the collector electrode 8 close to the base layer 21. The resulting transistor, therefore, holds a sufficient strength.

In the semiconductor device of the present invention and the method of manufacture thereof of the present invention, there is no need to perform epitaxial growth in order to obtain a grown layer for forming a device region. Consequently, this invention allows semiconductor devices to be manufactured readily.

Also, the bottom recessed part includes a bottom recessed face to which the electrode is attached, so that the electrode is allowed to place close to the device region. As a result, a semiconductor device having a low resistance value can be provided.

Further, the present method does not allow the semiconductor substrate to be formed thin throughout, partly providing with the bottom recessed part. As a result, the semiconductor device holds a sufficient strength, allowing the reliability of the device to be improved.

In the semiconductor device of the present invention and the method of manufacture thereof of the present invention, a great difference in resistance value between the semiconductor substrate and the electrode is relieved. Thus, generation of parasitic diodes can be avoided, and so a high-precision semiconductor device is realized.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A bipolar transistor comprising:
   A semiconductor substrate having a device region, and including a bottom recessed part with a bottom recessed face, the device region being in a top surface of the semiconductor substrate and formed near said bottom recessed face, said semiconductor substrate having a resistance value appropriate for forming a device region;
   an electrode connected to said bottom recessed face;
   an emitter region formed in said device region; and
   a base region formed in said semiconductor substrate between said emitter region and said electrode, wherein said electrode is spaced from a bottom surface of said base region by a distance of approximately 10 μm.

2. A bipolar transistor comprising:
a semiconductor substrate having a device region, and including a bottom recessed part with a bottom recessed face, the device region being in a top surface of the semiconductor substrate and formed near said bottom recessed face, said semiconductor substrate having a resistance value appropriate for forming a device region;
an electrode connected to said bottom recessed face;
an emitter region formed in said device region; and
a base region formed in said semiconductor substrate between said emitter region and said electrode, wherein said base region is approximately 2 μm thick.

* * * * *